(12) United States Patent
Kitagawa et al.

(10) Patent No.: US 6,747,334 B2
(45) Date of Patent: Jun. 8, 2004

(54) THIN-FILM CAPACITOR DEVICE (75) Inventors: Hitoshi Kitagawa, Miyagi-ken (JP); Makoto Sasaki, Miyagi-ken (JP)

(73) Assignee: ALPS Electric Co., Ltd, Tokyo (JP)

( * ) Notice: Subject to any disclaimer, the term of this patent is extended or adjusted under 35 U.S.C. 154(b) by 0 days.

(21) Appl. No.: 10/452,246

(22) Filed: May 30, 2003

(65) Prior Publication Data

US 2003/0213960 A1 Nov. 20, 2003

Related U.S. Application Data

(62) Division of application No. 10/100,935, filed on Mar. 18, 2002, now Pat. No. 6,605,515.

(30) Foreign Application Priority Data

Mar. 27, 2001 (JP) ........................................ 2001-089528

(51) Int. Cl.$^7$ ........................ H01L 29/00; H01L 27/108; H01L 21/20
(52) U.S. Cl. ........................ 257/532; 257/312; 438/381; 438/386; 438/393; 438/396
(58) Field of Search .................. 257/312, 516, 257/532; 438/381, 386, 393, 396

(56) References Cited

U.S. PATENT DOCUMENTS 5,923,524 A    7/1999    Cava
5,978,207 A    11/1999    Anderson et al.
6,002,578 A    12/1999    Kumagai et al.
6,251,816 B1 *    6/2001    Maher et al. ................ 501/138
6,482,527 B1 *    11/2002    Shrout et al. ................ 428/469

FOREIGN PATENT DOCUMENTS

JP    60-124303    7/1985
JP    63-110618    5/1988

* cited by examiner

*Primary Examiner*—Carl Whitehead, Jr.
*Assistant Examiner*—David L. Hogans
(74) *Attorney, Agent, or Firm*—Beyer Weaver & Thomas

(57) ABSTRACT

A thin-film capacitor device for performing temperature compensation is manufactured by layering a first dielectric thin-film and a second dielectric thin-film, wherein the second dielectric thin-film has a thickness $t_N$, wherein $t_N = \{\epsilon_0 \tau_{tOt}/(C/S)\} \cdot \{1/(\tau/\kappa)\}$, wherein C/S represents a sheet capacitance, $\epsilon_0$ represents the dielectric constant of vacuum, $\tau_{tOt}$ represents a desired temperature coefficient of capacitance, $\tau$ represents the temperature coefficient of capacitance of the second dielectric thin-film, and $\kappa$ represents the relative dielectric constant of the second dielectric thin-film, a target value of a grain size of the second dielectric thin-film is determined by selecting the grain size satisfying the formula $(\tau/\kappa)/(\tau_g/\kappa_g) > 1$, wherein $\tau_g$ represents the temperature coefficient of capacitance of the principal crystal grain, and $\kappa_g$ represents relative dielectric constant of the principal crystal grain, and the second dielectric thin-film is deposited so that the grain size becomes the target value.

1 Claim, 9 Drawing Sheets

$1.7 < a/2\Delta a < 13$
$17 \text{Å} < a < 130 \text{Å}$
$85 \text{Å} < b < 650 \text{Å}$

THIN-FILM CAPACITOR DEVICE

CROSS REFERENCE TO RELATED APPLICATION

This application is a divisional application of a U.S. Patent Application, having application Ser. No. 10/100,935 filed Mar. 18, 2002 now U.S. Pat. No. 6,605,515 entitled "METHOD FOR MANUFACTURING THIN-FILM CAPACITOR FOR PERFORMING TEMPERATURE COMPENSATION OF JUNCTION CAPACITANCE OF SEMICONDUCTOR DEVICE" by Kitagawa et al., which is incorporated herein by reference in its entirety for all purposes.

BACKGROUND OF THE INVENTION

1. Field of the Invention

The present invention relates to a method for manufacturing a thin-film capacitor for properly performing temperature compensation of the junction capacitance of a semiconductor device, a thin-film capacitor device having the thin-film capacitor manufactured by the method, and an electronic circuit having the thin-film capacitor device for performing temperature compensation of the electronic circuit.

2. Description of the Related Art

Thin-film capacitor devices generally have a substrate and a lower electrode, a dielectric layer, and an upper layer which are deposited on the substrate in that order. The thin-film capacitor devices also have a semiconductor substrate functioning as a lower electrode and have a dielectric layer and an upper layer which are deposited on the semiconductor substrate in that order in some cases.

The thin-film capacitor devices are required to have a large relative dielectric constant and Q factor and a temperature coefficient of capacitance of near 0 at a resonant frequency.

Hitherto, the following compounds are known as dielectrics having the above characteristics: $BaO$—$TiO_2$ dielectrics containing $Sm_2O_3$, $Gd_2O_3$, $Dy_2O_3$, or $Eu_2O_3$. However, when manufacturing such dielectrics using conventional techniques, the relative dielectric constant is adjustable only in the range of 61 to 72 and the temperature coefficient of capacitance is adjustable only in the range of −24 to 31 ppm/° C.

For the above background, research and development has been conducted. A dielectric ceramic having the following structure has been proposed: a multilayer including a first dielectric ceramic sheet having a positive temperature coefficient of capacitance at a resonant frequency and a second dielectric ceramic sheet having a negative temperature coefficient of capacitance at a resonant frequency.

According to this method, the multilayered dielectric ceramic is prepared as follows: a mixture having a desired composition is formed into a disk having a diameter of 16 mm and a thickness of 9 mm, the disk is fired at 1,260° C. to 1,450° C. for several hours, a first dielectric ceramic is then obtained; and another mixture having a different composition from the above composition is formed into another disk, the disk is fired, and a second dielectric ceramic is then obtained; each of the first and second dielectric ceramics is cut into a sheet having a thickness of 1 mm; and both the sheets are layered to complete the multilayered dielectric ceramic. The relative dielectric constant and the temperature coefficient of capacitance of the multilayered dielectric ceramic can be adjusted by using materials having different relative dielectric constants or using sheets which are made of the same material and have different thicknesses.

According to the above method, since the multilayered capacitors are manufactured by layering the fired first and second dielectric ceramics, each having a thickness of 1 mm, the miniaturization and a reduction in thickness are limited. For example, thin-film capacitors having a thickness of 1 mm or less cannot be manufactured.

When the dielectric ceramic sheets are laminated, an adhesion layer or an air layer which has a different dielectric constant exists between the sheets. Such a structure has a plurality of portions, each having a different dielectric constant, in the thickness direction of the layered sheets; hence there is a problem in that it is difficult to manufacture capacitors having a desired temperature coefficient of capacitance.

Furthermore, the sheet dielectric ceramic is polycrystalline and subsequently has a plurality of grain boundaries in the thickness direction; hence, reduction in the dielectric loss at a high frequency of 1 GHz or more is difficult.

In thin-film capacitors, the desired thickness of the second dielectric thin-film is inversely proportional to a ratio of the absolute value of the temperature coefficient of capacitance to the relative dielectric constant (hereinafter referred to as a ratio τ/κ). That is, as the thickness of the dielectric thin-film increases, as the absolute value of the ratio τ/κ decreases. The relationship is more significant at a high relative dielectric constant. It is subsequently difficult to manufacture thin-film capacitors having a high relative dielectric constant and a small thickness even if the above methods are improved.

In a thin-film capacitor having a first dielectric thin-film and a second dielectric thin-film which are layered, the thickness of each of the first and second dielectric thin-films is determined according to the relative dielectric constant and the temperature coefficient of capacitance. When a capacitor device having a sheet capacitance of (C/S) pF/mm² includes a dielectric thin-film (controlled film: first dielectric thin-film: referred to as film C) having a relative dielectric constant $\kappa_C$ and a temperature coefficient of capacitance of 0 ppm/° C., and includes another dielectric thin-film (second dielectric thin-film: referred to as film N) having a relative dielectric constant $\kappa_N$ and a temperature coefficient of capacitance of $\tau_N$ ppm/° C., the following formulas (1) and (2) are obtained for the thickness $t_C$ of the first dielectric thin-film, the thickness $t_N$ of the second dielectric thin-film, and dielectric $\epsilon_0$ constant of vacuum:

$$t_N = \frac{\varepsilon_0 \tau}{(C/S)} \frac{1}{\left(\frac{\tau_N}{\kappa_N}\right)} \text{ and} \tag{1}$$

$$t_C = \frac{\varepsilon_0 \kappa_C}{(C/S)} - t_N \frac{\kappa_C}{\kappa_N}. \tag{2}$$

The above formulas (1) and (2) show that the thickness $\tau_N$ of the second dielectric thin-film (film N) is determined according to the ratio $\tau_N/\kappa_N$. Hitherto, in order to obtain a second dielectric thin-film having a smaller thickness, changing the ratio $\tau_N/\kappa_N$, that is, increasing the ratio $\tau_N/\kappa_N$ by using different materials, is required. That is, developing a new dielectric material having a large value of the ratio $\tau_N/\kappa_N$ is necessary.

SUMMARY OF THE INVENTION

Accordingly, it is an object of the present invention to provide a method for manufacturing a thin-film capacitor for properly performing temperature compensation. In the thin-film capacitor, the miniaturization and a reduction in the thickness and the weight can be achieved. It is another object of the present invention to provide a thin-film capacitor device having the thin-film capacitor manufactured by the method. It is another object of the present invention to provide an electronic device having the thin-film capacitor manufactured by the method. It is another object of the present invention to provide an electronic circuit having the thin-film capacitor device manufactured by the method.

In order to solve the above problems, in a method for manufacturing a thin-film capacitor having a desired sheet capacitance and a desired temperature coefficient of capacitance by depositing a first dielectric thin-film having a temperature coefficient of capacitance with an absolute value of 50 ppm/° C. or less and a second dielectric thin-film having a negative temperature coefficient of capacitance, wherein the second dielectric thin-film has a structure composed of an aggregation of principal grain units each having a principal crystal grain and grain boundary layers surrounding the principal crystal grain, includes a plurality of principal grain units, and has a thickness $t_N$, wherein $t_N = \{\epsilon_0 \tau_{r0t}/(C/S)\} \cdot \{1/(\tau/\kappa)\}$, wherein C/S represents the sheet capacitance, $\epsilon_0 \tau_{r0t}$ represents the desired temperature coefficient of capacitance, $\tau$ represents the temperature coefficient of capacitance of the second dielectric thin-film, and $\kappa$ represents the relative dielectric constant of the second dielectric thin-film, the method includes determining a target value of a grain size of the second dielectric thin-film by selecting the grain size satisfying the formula $(\tau/\kappa)/(\tau_g/\kappa_g) > 1$, wherein $\tau_g$ represents the temperature coefficient of capacitance of the principal crystal grain, and $\kappa_g$ represents the relative dielectric constant of the principal crystal grain, and depositing the second dielectric thin-film so that the grain size becomes the target value to reduce the thickness of the second dielectric thin-film.

According to the present invention, thinner thin-film capacitors in which a reduction in the thickness and the weight is achieved can be manufactured without using a newly developed material. For a thin-film capacitor having a first dielectric thin-film and a second dielectric thin-film which are laminated, the inventors have been discovered that a thin-film capacitor having a smaller thickness and a desired relative dielectric constant and temperature coefficient of capacitance can be obtained by adjusting the size of a principal crystal grain in the second dielectric thin-film. Based on the relationship, thin-film capacitors having a smaller thickness can be obtained. That is, thin-film capacitors having a thinner dielectric thin-film can be obtained by adjusting the size of the principal crystal grain so that the ratio $(\tau/\kappa)/(\tau_g/\kappa_g)$ exceeds 1, wherein the ratio $(\tau/\kappa)$ belongs to the dielectric thin-film and the ratio $(\tau_g/\kappa_g)$ belongs to the principal crystal grain.

In order to solve the above problems, in a method for manufacturing a thin-film capacitor having a desired sheet capacitance and a desired temperature coefficient of capacitance by depositing a first dielectric thin-film having a temperature coefficient of capacitance with an absolute value of 50 ppm/° C. or less and a second dielectric thin-film having a negative temperature coefficient of capacitance, wherein the second dielectric thin-film has a structure composed of an aggregation of principal grain units each having a principal crystal grain and grain boundary layers surrounding the principal crystal grain, includes a plurality of principal grain units, and has a thickness $t_N$, wherein $t_N = \{\epsilon_0 \tau_{r0t}/(C/S)\} \cdot \{1/(\tau/\kappa)\}$, wherein C/S represents the sheet capacitance, $\epsilon_0 \tau_{r0t}$ represents the desired temperature coefficient of capacitance, $\tau$ represents the temperature coefficient of capacitance of the second dielectric thin-film, and $\kappa$ represents the relative dielectric constant of the second dielectric thin-film, the method includes determining a target value of a grain size of the second dielectric thin-film by selecting the ratio $a/2\Delta a$ satisfying the formula $(\tau/\kappa)/(\tau_g/\kappa_g) > 1$ when the ratio $b/a$ is constant, wherein $\tau_g$ represents the temperature coefficient of capacitance of the principal crystal grain, $\kappa_g$ represents the relative dielectric constant of the principal crystal grain, a represents the width of each principal grain unit, which includes the principal crystal grain and the grain boundary layers, in the lateral direction, $\Delta a$ represents the thickness of each grain boundary layer, $2\Delta a$ represents the thickness of a grain boundary, and b represents the height of the principal grain unit, and depositing the second dielectric thin-film so that the grain size becomes the target value to reduce the thickness of the second dielectric thin-film.

According to the present invention, thinner thin-film capacitors in which a reduction in the thickness and the weight is achieved can be manufactured without using a newly developed material. For a thin-film capacitor having a first dielectric thin-film and a second dielectric thin-film which are laminated, the inventors have been discovered that a thin-film capacitor having a smaller thickness and a desired relative dielectric constant and temperature coefficient of capacitance can be obtained by adjusting the size of a principal crystal grain in the second dielectric thin-film using the relationship between the ratio $a/2\Delta a$ of a principal crystal grain in the dielectric thin-film and the ratio $\tau/\kappa$, of the dielectric thin-film. Based on the relationship, thin film capacitors having a smaller thickness can be obtained.

That is, thin-film capacitors having a thinner dielectric thin-film can be obtained by adjusting the size of the principal crystal grain so that the ratio $(\tau/\kappa)/(\tau_g/\kappa_g)$ exceeds 1, wherein the ratio $(\tau/\kappa)$ belongs to the dielectric thin-film and the ratio $(\tau_g/\kappa_g)$ belongs to the principal crystal grain.

In order to solve the above problems, in a method for manufacturing a thin-film capacitor having a desired sheet capacitance and a desired temperature coefficient of capacitance by depositing a first dielectric thin-film having a temperature coefficient of capacitance with an absolute value of 50 ppm/° C. or less and a second dielectric thin-film having a negative temperature coefficient of capacitance, wherein the second dielectric thin-film has a structure composed of an aggregation of principal grain units each having a principal crystal grain and grain boundary layers surrounding the principal crystal grain, includes a plurality of principal grain units, and has a thickness $t_N$, wherein $t_N = \{\epsilon_0 \tau_{r0t}/(C/S)\} \cdot \{1/(\tau/\kappa)\}$, wherein C/S represents a sheet capacitance, $\epsilon_0 \tau_{r0t}$ represents a desired temperature coefficient of capacitance, $\tau$ represents the temperature coefficient of capacitance of the second dielectric thin-film, and $\kappa$ represents the relative dielectric constant of the second dielectric thin-film, the method includes depositing the second dielectric thin-film so that the ratio $(\tau(x)/\kappa(x))/(\tau_g/\kappa_g)$ is 1.10 or more, wherein $\kappa(x)/\kappa_g = \gamma[(x-1)^2/(\gamma x - 1 + \kappa_g/\kappa_{gb}) + \{(2-1/x)/\gamma\}/(\kappa_g/\kappa_{gb})]/x$, that is, $\kappa(x)$ indicates that the $\kappa$ is the function of x, $\tau(x)/\tau_g = 1 - [(\kappa_g/\kappa_{gb}) \cdot (1-\tau_{gb}/\tau_g) \cdot \{(\kappa_g/\kappa_{gb})^2 (x-1)^2 + (\gamma x - 1 + \kappa_g/\kappa_{gb})^2 (2-1/x)\gamma\}/(\kappa_g/\kappa_{gb}) \cdot (\gamma x - 1 + \kappa_g/\kappa_{gb}) \cdot \{(x-1)^2 \cdot (\gamma x - 1 + \kappa_g/\kappa_{gb}) \cdot (2-1/x)/\gamma\}]$, $\tau_g$ represents the temperature coefficient of capacitance of the principal crystal grain, $\kappa_g$ represents the relative dielectric constant of the principal crystal grain, x, which is a dimensionless parameter, represents the ratio $a/2\Delta a$, γ, which is a dimensionless parameter, represents the ratio b/a, $\kappa_{gb}$ represents the relative dielectric constant of the grain boundary, a represents the width of each principal grain unit, which includes the principal crystal grain and the grain boundary layers, in the lateral direction, Δa represents the thickness of each grain boundary layer, 2Δa represents the thickness of a grain boundary, and b represents the height of the principal grain unit.

According to the present invention, thinner thin-film capacitors in which a reduction in the thickness and the weight is achieved can be manufactured without using a newly developed material. For a thin-film capacitor having a first dielectric thin-film and a second dielectric thin-film which are laminated, the inventors have been discovered that a thin-film capacitor having a smaller thickness and a desired relative dielectric constant and temperature coefficient of capacitance can be obtained by adjusting the size of a principal crystal grain in the second dielectric thin-film using the relationship between the ratio a/2Δa of a principal crystal grain in the dielectric thin-film and the ratio τ/κ of the dielectric thin-film. Based on the relationship, thin-film capacitors having a smaller thickness can be obtained.

In the present invention, the second dielectric thin-film is manufactured such that the ratio $(\tau(x)/\kappa(x))/(\tau_g/\kappa_g)$ is 1.25 or more.

When the ratio $(\tau(x))/\kappa(x))/(\tau_g/\kappa_g)$ is 1.25 or more, a further reduction in the thickness and the miniaturization can be achieved compared with a state in which the ratio $(\tau(x)/\kappa(x))/(\tau_g/\kappa_g)$ is 1.10.

In the present invention, the averages of the ratio a/2Δa and the ratio b/a satisfy the conditions $1.7 \leq a/2\Delta a \leq 13$ and $5 \leq b/a$.

In the present invention, the averages of the ratio a/2Δa and the ratio b/a satisfy the conditions $1.8 \leq a/2\Delta a \leq 6$ and $5 \leq b/a$.

When the above conditions are satisfied, a reduction in the thickness and the miniaturization can be achieved.

In the present invention, the second dielectric thin-film has a relative dielectric constant of 100 or more.

In the present invention, the second dielectric thin-film includes any one selected from the group consisting of $Sr_xBa_{1-x}TiO_3$, $CaTiO_3$, and $PbTiO_3$.

When the dielectric thin-film includes the material, adjusting the grain size is possible; thereby achieving a reduction in the thickness and the miniaturization by adjusting the grain size.

A thin-film capacitor device according to the present invention performs temperature compensation and includes electrodes and a thin-film capacitor placed therebetween, wherein the thin-film capacitor is manufactured by any one of the above methods.

An electronic device includes a thin-film capacitor manufactured by any one of the above methods.

The thin-film capacitor has a desired temperature coefficient of capacitance and a reduction in the thickness and the miniaturization can be achieved.

An electronic circuit according to the present invention includes a thin-film capacitor device and a varactor diode connected in parallel to the thin-film capacitor device, wherein the thin-film capacitor device has electrodes connected to input/output terminals and has a thin-film capacitor which is manufactured by any one of the above method and is placed between the electrodes.

Since the varactor diode has a positive temperature coefficient of capacitance, the temperature coefficient of capacitance of the varactor diode can be compensated by the temperature coefficient of capacitance of the thin-film capacitor device by connecting in parallel the varactor diode to the thin-film capacitor device; thereby achieving excellent temperature stability.

DESCRIPTION OF THE PREFERRED EMBODIMENTS

The embodiments of the present invention will now be described with reference to the drawings. The present invention is not limited to these embodiments.

Figure 1:
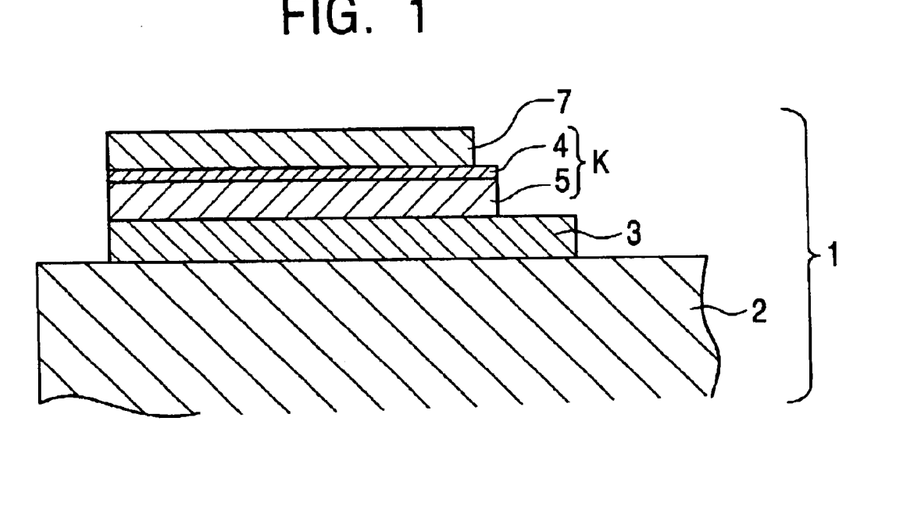
FIG. 1 is a sectional view showing a thin-film capacitor device for performing temperature compensation according to a first embodiment of the present invention.

FIG. 1 shows a thin-film capacitor device 1 of a first embodiment according to the present invention. The thin-film capacitor device 1 has a substrate 2 having a rectangular shape in plan view, a first electrode layer (lower electrode layer) 3, a second dielectric thin-film 5, a first dielectric thin-film 4, and a second electrode layer (upper electrode layer) 7, which are deposited on the substrate 2 in that order. In the thin-film capacitor device 1, a thin-film capacitor κ is composed of the first dielectric thin-film 4 and the second dielectric thin-film 5.

The material of the substrate 2 is not limited as long as it has a sufficient thickness to provide an appropriate stiffness to the entire capacitor device. The material is also resistant to a deposition temperature while the above layers are deposited on the substrate 2.

An exemplary material satisfying the above conditions is a silicon-covered member such as a silicon wafer or a substrate made of $SiO_2$ or $Al_2O_3$.

The first electrode layer 3 and the second electrode layer 7 may have a single layer structure made of a single metal such as Cu, Ag, Au, and Pt, or may have a multilayer structure. The multilayer structure may have at least two selected from the group consisting of a silicon oxide layer, a chromium layer, a nickel layer, a chromium oxide layer, a nickel oxide layer, and a platinum layer.

The first dielectric thin-film 4 has a higher dielectric strength and a higher Q factor than those of the second dielectric thin-film 5, and the dielectric strength and the Q factor preferably changes slightly according to changes in temperature.

Specifically, the first dielectric thin-film 4 preferably has a temperature coefficient of capacitance with an absolute value of 50 ppm/° C. or less, a relative dielectric constant of 10 or less, a field strength of 5 MV/cm or more and more preferably 8 MV/cm or more, an unloaded Q factor of 200 or more and more preferably 500 or more (at a frequency of 1 GHz or more), and a dielectric relaxation time of 1 second or more. The first dielectric thin-film 4 has a thickness of 1 μm (1×10⁻⁶ m) or less, and more preferably 250 to 5,000 Å (0.025 to 0.5 μm). Satisfying the above conditions provides an appropriate dielectric strength to the thin-film capacitor device 1; thereby achieving high productivity and reduction in the thickness.

An exemplary material satisfying the above conditions includes amorphous $SiO_xN_y$ and $SiO_x$. An amorphous $SiO_xN_y$ layer may be formed by a sputtering process or a PECVD process.

The second dielectric thin-film 5 may have a lower dielectric strength and a lower Q factor than those of the first dielectric thin-film 4, and it is preferable that the changes in the dielectric strength and in the Q factor of the second dielectric thin-film 5 according to changes in temperature are larger than the changes in those of the first dielectric thin-film 4.

Specifically, the second dielectric thin-film 5 preferably has a negative temperature coefficient of capacitance with an absolute value of 500 ppm/° C. or more, a relative dielectric constant of 150 or less, a unloaded Q factor of 50 or more and more preferably 100 or more (at a frequency of 1 GHz or more), and a dielectric relaxation time of 1 second or more.

The second dielectric thin-film 5 has a thickness of 1 μm or less, preferably 0.025 μm (250 Å) to 0.5 μm (5,000 Å), and more preferably 0.025 μm (250 Å) to 0.3 μm (3,000 Å). The above conditions are based on the following reasons: preventing a plurality of grain boundaries from forming in the thickness direction of the layer when principal crystal grains included in the second dielectric thin-film 5 have a length of, for example, 0.5 μm to 1 μm in the planar direction; and reducing a deposition time as much as possible even if a thick layer is formed. The second dielectric thin-film 5 has a structure in which each of the principal crystal grains is surrounded by grain boundary layers, which will be described below.

The above conditions are further based on the reason for preventing a large number of grain boundaries, for example, 10 or more, from forming in the thickness direction when the principal crystal grains have a diameter of, for example, 0.1 μm to 0.5 μm. The number of grain boundaries is preferably small and more preferably two or less, and it is ideal if no grain boundary exists in the thickness direction, that is, only a single grain exists in the thickness direction.

The relationship between the grain size and the thickness of the second dielectric thin-film 5 will now be described.

Figure 3A:
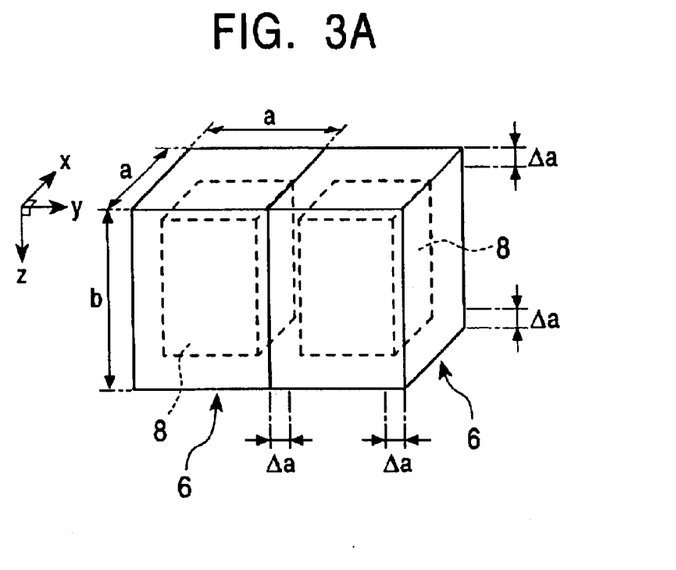
FIG. 3A is a perspective view showing a principal grain unit including a principal crystal grain and grain boundary layers surrounding the same.

In the present invention, the structure of the second dielectric thin-film 5 is described according to a crystal aggregation model shown in FIG. 3A. In the crystal aggregation model, a principal grain unit 6 is assumed to be a rectangular parallelepiped having a height b in the Z direction (in the thickness direction) and a square (having both sides of length a in the planar direction) with a side of length of a in the X direction and with another side of length of a in the Y direction.

Furthermore, the following structures are assumed: a principal grain 8 covered with grain boundary layers 9 each having a uniform thickness of Δa in the principal grain unit 6; and the second dielectric thin-film 5 having a large number of the principal grain units 6 which are joined together.

According to the above description, in the principal crystal grain 8, the length of a side in the X direction is a-2Δa, the length of the other side in the Y direction is a-2Δa, and the length of the height in the Z direction is b-2Δa. A large number of the principal grain units 6 having the above dimensions are arranged in the planar direction and in the thickness direction in the second dielectric thin-film 5.

When the grain diameter is represented by a dimensionless parameter x, which belongs to the principal crystal grain, the formula x≡a/Δa is obtained by normalization and formulation. When the grain height is represented by a dimensionless parameter γ, the following formulas are obtained: γ≡b/a and b/2Δa=γx. These parameters show the shape of the principal crystal grain. For example, when γ has a large value, that is, b is larger than a, the grain is long in the thickness direction of the layer. Since the relative dielectric constant κ is a function of x according to the above formulas and crystallographic bulk crystal calculation, formula (3) is obtained as follows:

$$\kappa(x)/\kappa_g = \gamma \left\{ \frac{(x-1)^2}{\gamma x - 1 + \kappa_g/\kappa_{gb}} + \frac{(2-1/x)/\gamma}{\kappa_g/\kappa_{gb}} \right\} / x. \quad (3)$$

Formula (3) is also expressed as follows:

$$\kappa(x)/\kappa_g = \gamma[(x-1)^2/(\gamma x - 1 + \kappa_g/\kappa_{gb}) + \{(2-1/x)/\gamma\}/(\kappa_g/\kappa_{gb})]/x \quad (3).$$

In formula (3), κ(x) is used to indicate that κ represents the relative dielectric constant and κ is a function of x. In formula (3), $\kappa_g$ represents the relative dielectric constant of the grain and $\kappa_{gb}$ represents the relative dielectric constant of the grain boundary.

Next, the temperature coefficient of capacitance is normalized and formulated according to the same method as above. When the temperature coefficient of capacitance Y is a function of x, $\tau_g$ represents the temperature coefficient of capacitance of the grain, and $\tau_{gb}$ represents the temperature coefficient of capacitance of the grain boundary, formula (4) is obtained as follows:

$$\tau(x)/\tau_g = 1 - (\kappa_g/\kappa_{gb}) \times \alpha - \tau_{gb}/\tau_g) \times \frac{(\kappa_g/\kappa_{gb})^2(x-1)^2 + \left(\gamma x - 1 + \frac{\kappa_g}{\kappa_{gb}}\right)^2 \cdot \left(\left(2 - \frac{1}{x}\right)/\gamma\right)}{\left(\frac{\kappa_g}{\kappa_{gb}}\right)\left(\gamma x - 1 + \frac{\kappa_g}{\kappa_{gb}}\right) \cdot \left\{(x-1)^2\left(\frac{\kappa_g}{\kappa_{gb}}\right) + \left(\gamma x - 1 + \frac{\kappa_g}{\kappa_{gb}}\right) \cdot \left(2 - \frac{1}{x}\right)/\gamma\right\}} \quad (4)$$

Formula (4) is also expressed as follows:

$\tau(x)/\tau_g = 1 - [(\kappa_g/\kappa_{gb}) \cdot$ $(1 - \tau_{gb}/\tau_g) \cdot \{(\kappa_g/\kappa_{gb})$ $^2(x-1)^2 + (\gamma x - 1 + \kappa_g/\kappa$ $_{gb})^2 (2 - 1/x)\gamma\}/(\kappa_g/\kappa_{gb}) \cdot$ $(\gamma x - 1 + \kappa_g/\kappa_{gb}) \cdot \{(x-1)^2$ $\cdot (\kappa_g/\kappa_{gb}) + (\gamma x - 1 + \kappa_g/\kappa_{gb}) \cdot$ $(2 - 1/x)/\gamma\}]$ (4).

For $\tau(x)$, $\kappa(x)$, and $\tau_g/\kappa_g$, formula (5) is obtained as follows:

$$\left\{\frac{\tau(x)}{\kappa(x)}\right\} \Big/ \left\{\frac{\tau_g}{\kappa_g}\right\} = \left\{\frac{\tau(x)}{\tau_g}\right\} \Big/ \left\{\frac{\kappa(x)}{\kappa_g}\right\}. \quad (5)$$

Formula (5) is also expressed as follows:

$\{\tau(x)/\kappa(x)\}/\{\tau_g/\kappa_g\} = \{\tau(x)/\tau_g\}/\{\kappa(x)/\kappa_g\}$ (5).

The temperature coefficient of capacitance is defined as follows: $\tau \equiv (\partial \kappa/\partial T)/\kappa$, wherein T represents the absolute temperature. This formula indicates changes in the relative dielectric constant $\kappa$ (or the temperature coefficient of capacitance) according to changes in temperature. Thus, the ratio $\tau/\kappa$ is an important parameter in forming thin-films.

Figure 4A:
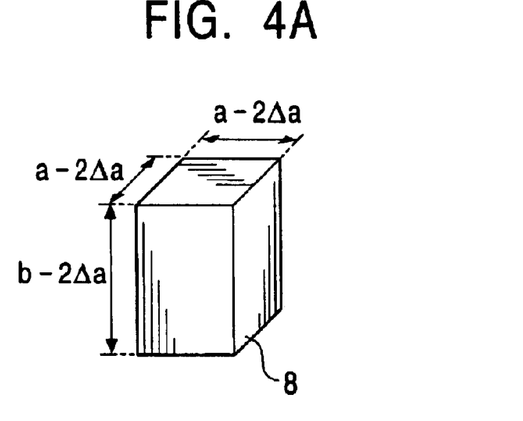
FIG. 4A is a perspective view showing a model of the principal crystal grain.

The derivation procedure of each formula shown above will now be described in detail. As shown in FIG. 4A, the principal grain 8 has a width of a−2Δa in the X direction (in the planar direction), another width of a−2Δa in the Y direction (in the planar direction), and a height b in the Z direction (in the thickness direction). When $C_g^{(1)}$ represents the capacitance of a capacitor having a microstructure in which electrode layers are placed on and under the principal grain 8, formula (6) is obtained as follows:

$$C_g^{(1)} = \frac{\varepsilon_g}{b - 2\Delta a}(a - 2\Delta a)^2. \quad (6)$$

In formula (6), $\epsilon$ represents the dielectric constant, $\kappa$ represents the relative dielectric constant, and $\epsilon_0$ represents the dielectric constant of vacuum. The formula $\epsilon = \epsilon_0 \kappa$ is then obtained.

Figure 4B:
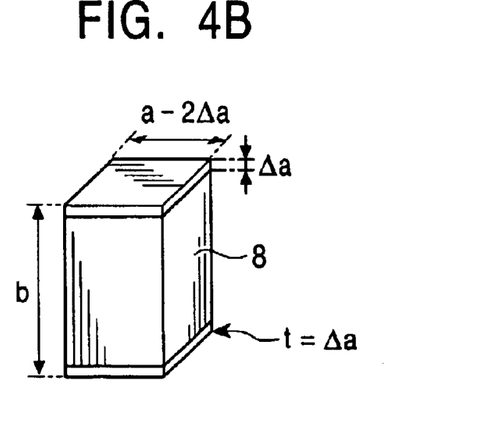
FIG. 4B is a perspective view showing a model structure in which the principal crystal grain is sandwiched between grain boundary layers.

As shown in FIG. 4B, the grain boundary layers having a thickness of Δa are placed on and under the principal grain 8, that is, the principal grain 8 is sandwiched between the grain boundary layers. When $C^{(1)(in)}$ represents the capacitance of the structure, formula (7) is obtained as follows:

$$C^{(1)(in)} = \frac{(a - 2\Delta a)^2}{\frac{b - 2\Delta a}{\varepsilon_g} + \frac{2\Delta a}{\varepsilon_{gb}}}. \quad (7)$$

The principal grain unit 6 has a structure in which the grain boundary layers having a thickness of Δa are placed on the four lateral faces of the principal grain 8. When $C^{(1)}$ represents the capacitance of this structure, formula (8) is obtained as follows:

$$C^{(1)} = \frac{(a - 2\Delta a)^2}{\frac{b - 2\Delta a}{\varepsilon_g} + \frac{2\Delta a}{\varepsilon_{gb}}} + \frac{4\varepsilon_{gb}(a - \Delta a)\Delta a}{b}. \quad (8)$$

Figure 4C:
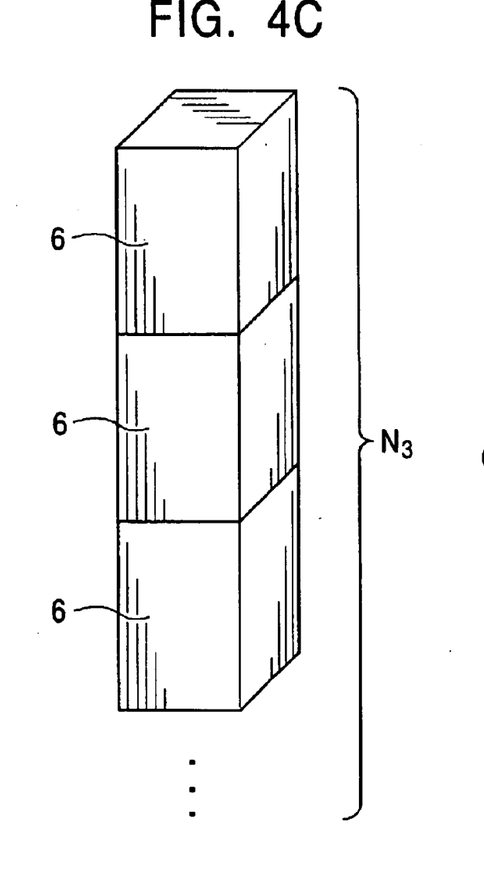
FIG. 4C is a perspective view showing another structure in which an $N_3$ the principal grain units are arranged in the longitudinal direction.

FIG. 4C shows a structure in which the $N_3$ principal grain units 6 are longitudinally arranged. When $C^{(1B)}$ represents the capacitance of this structure, formula (9) is obtained as follows:

$$C^{(1B)} = \frac{C^{(1)}}{N_3}. \quad (9)$$

Figure 4D:
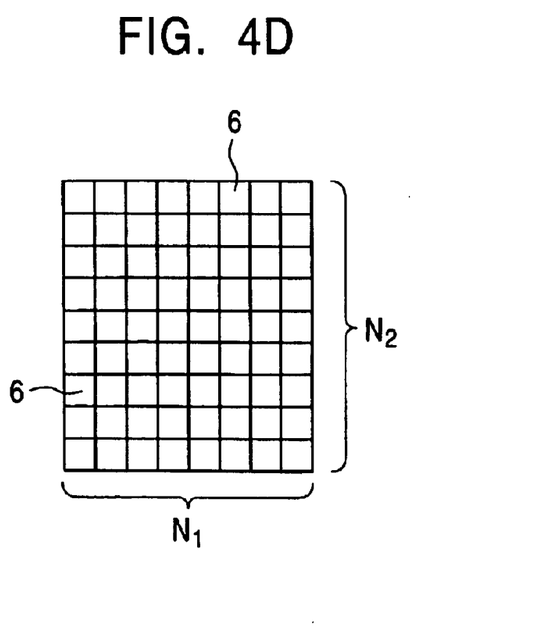
FIG. 4D is a plan view showing another structure in which an $N_1 \times N_2$ the principal grain units are arranged in the planar direction.

FIG. 4D shows a structure in which the $N_1 \times N_2$ units are arranged in plan view. The capacitance $C^{(1B)}$ of the structure in which $N_3$ units are longitudinally arranged is determined according to formula (9). The capacitance of the second dielectric thin-film having the $N_1 \times N_2$ units is expressed by formula (10), that is, the formula shows the total capacitance of the second dielectric thin-film.

$$C = C^{(NB)} = \frac{N_1 N_2}{N_3} C^{(1)}. \quad (10)$$

When the thickness of the second dielectric thin-film 5 is denoted as $t_N$ and the electrode surface area is denoted as S, formula (11) is obtained as follows:

$$C = \frac{\varepsilon}{t} S = \varepsilon \frac{S}{t} = \varepsilon \frac{N_1 N_2 a^2}{N_3 b}. \quad (11)$$

From formula (11), the formula $C = \epsilon(N_1 N_2 a_2/N_3 b) = C \times (N_3 b/N_1 N_2 a_2) = (b/a^2) \cdot C \cdot (N_3/N_1 N_2)$ is obtained.

From formula (10), the formula $C = (N_3/N_1 N_2)C^{(1)}$ is obtained. When using the relationship and the above formula, the formula $C = (b/a^2) \cdot C \cdot (N_3/N_1 N_2) = (b/a^2) \cdot (N_3/N_1 N_2) C^{(1)} \cdot (N_3/N_1 N_2)$ is obtained and formula (12) is also obtained as follows:

$$\varepsilon = \frac{b}{a^2} C^{(1)}. \quad (12)$$

When using the dimensionless parameters of $x \equiv a/2\Delta a$, $\gamma \equiv a/\Delta a$, and $\gamma x \equiv b/2\Delta a$, formula (12) is derived into formula (13) as follows:

$$\varepsilon = \frac{\gamma}{x}\left\{\frac{(x-1)^2}{\frac{\gamma x - 1}{\varepsilon_g} + \frac{1}{\varepsilon_{gb}}} + \frac{\varepsilon_{gb}(2x-1)}{\gamma x}\right\}. \quad (13)$$

When $\kappa$ is normalized with $\kappa_g$ in formula (13) using the equation $\epsilon = \kappa\epsilon_0$, following formula (14) is obtained. In formula (14), $\kappa(x)$ indicates that $\kappa$ is a function of x.

$$\kappa/\kappa_g = \kappa(x)/\kappa_g \quad (14)$$

$$= \frac{\gamma}{x}\left\{\frac{(x-1)^2}{(\gamma x - 1) + \frac{\kappa_g}{\kappa_{gb}}} + \frac{1/\gamma(2 - 1/x)}{\frac{\kappa_g}{\kappa_{gb}}}\right\}.$$

Next, the derivation of the temperature coefficient of capacitance $\tau$ will now be described. Based on the definition of the temperature coefficient of capacitance $\tau$, formula (15) is obtained as follows:

$$\tau \equiv \frac{\frac{\partial \kappa}{\partial T}}{\kappa} = \frac{\partial \ln\kappa}{\partial T}. \quad (15)$$

Thus, by taking logarithms of formula (14), differentiating the resulting formula with an absolute temperature T, and then deriving the resulting formula using formula (15), formula (4) is obtained. Also, by dividing $\{\tau(x)/\tau_g\}$ with $\{\kappa(x)/\kappa_g\}$, formula (5) is obtained.

Figure 3B:
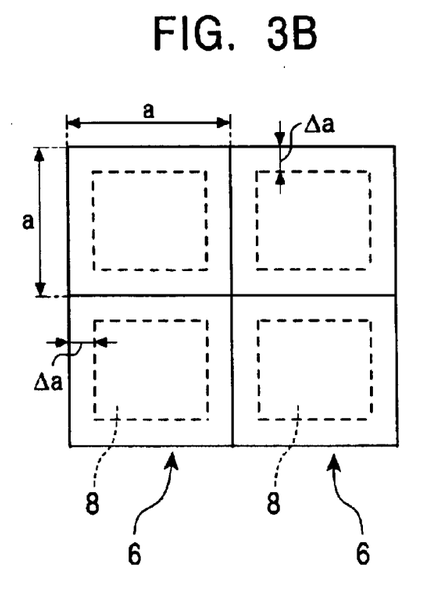
FIG. 3B is a plan view showing a structure in which a number of principal grain units are joined to each other.
Figure 3C:
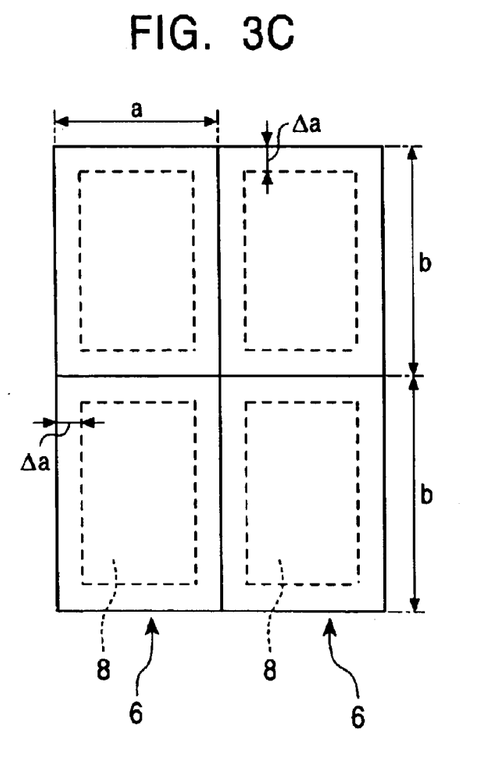
FIG. 3C is an elevation view showing the above structure.

According to the above findings, for the crystal structure shown in FIGS. 3 and 4, the relative dielectric constant can be obtained using formula (3) and the normalized temperature coefficient of capacitance can be obtained using formula (4).

Based on the above calculation models, the relative dielectric constant, the temperature coefficient of capacitance, and the $\tau/\kappa$, ratio of the second dielectric thin-film, which is an aggregation of the principal grain units, are obtained and the results are shown in FIGS. 5 to 8.

Figure 5:
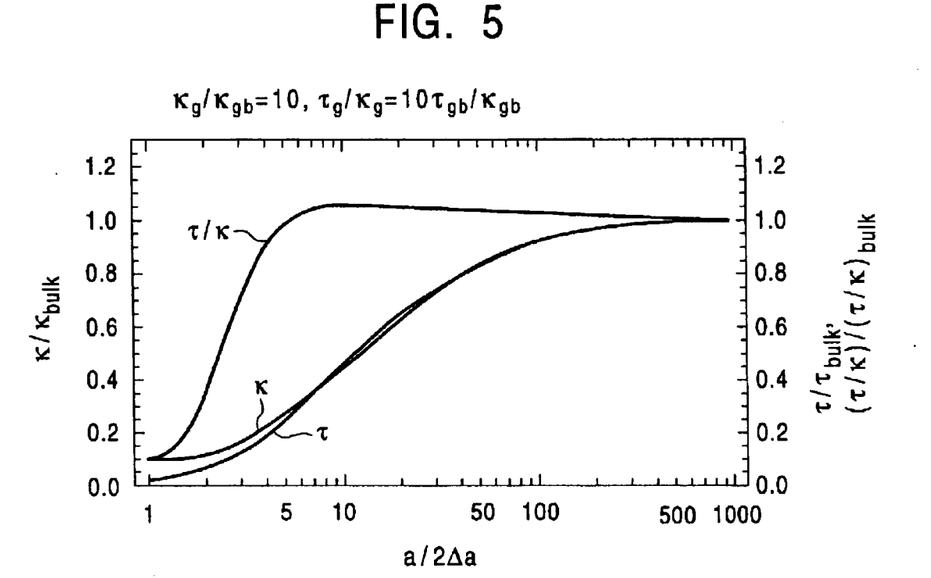
FIG. 5 is a graph illustrating $(\tau/\kappa)/(\tau/\kappa)$bulk, $\tau/\tau_{bulk}$, and $\kappa/\kappa_{bulk}$ according to a/2Δa when $\kappa_g/\kappa_{gb}=10$ and $\tau_g/\kappa_g=10\cdot\tau_{gb}/\kappa_{gb}$.
Figure 6:
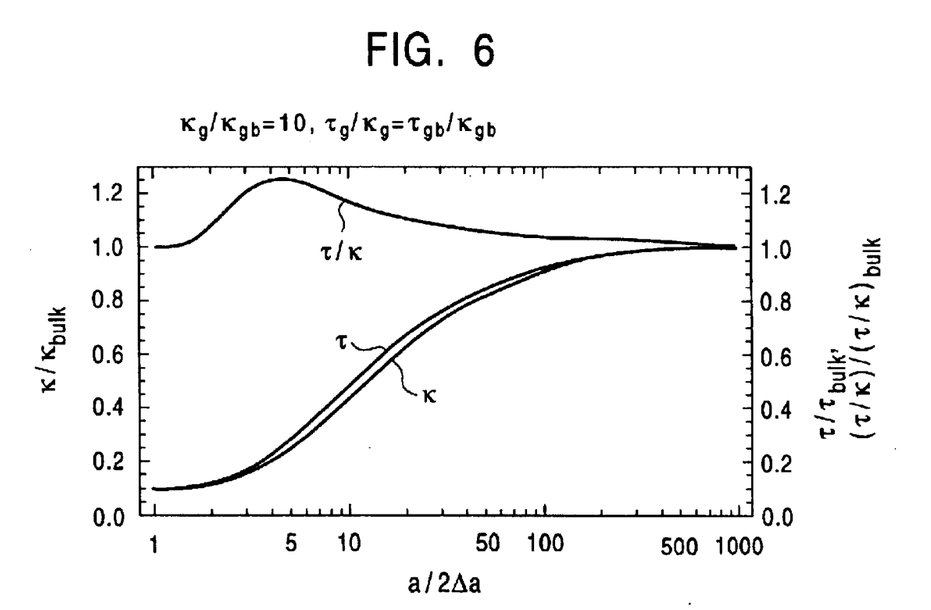
FIG. 6 is a graph illustrating $(\tau/\kappa)/(\tau/\kappa)_{bulk}$, $\tau/\tau_{bulk}$, and $\kappa/\kappa_{bulk}$ according to a/2Δa when $\kappa_g/\kappa_{gb}=10$ and $\tau_g/\kappa_g=\tau_{gb}/\kappa_{gb}$.

FIG. 5 shows the calculation results based on the assumption that the relative dielectric constant $\kappa_g$ and the ratio $\tau_g/\kappa_g$ of the principal grain unit are ten times greater than those of the grain boundary. FIG. 6 shows the calculation results based on the assumption that the relative dielectric constant $\kappa_g$ and the temperature coefficient of capacitance $\tau_g$ of the principal grain unit are ten times greater than those of the grain boundary.

Each result shows that the curve of the ratio $\tau_g/\kappa_g$ has a peak between $a/2\Delta a=1$ to $a/2\Delta a=20$ in the horizontal axis.

Figure 7:
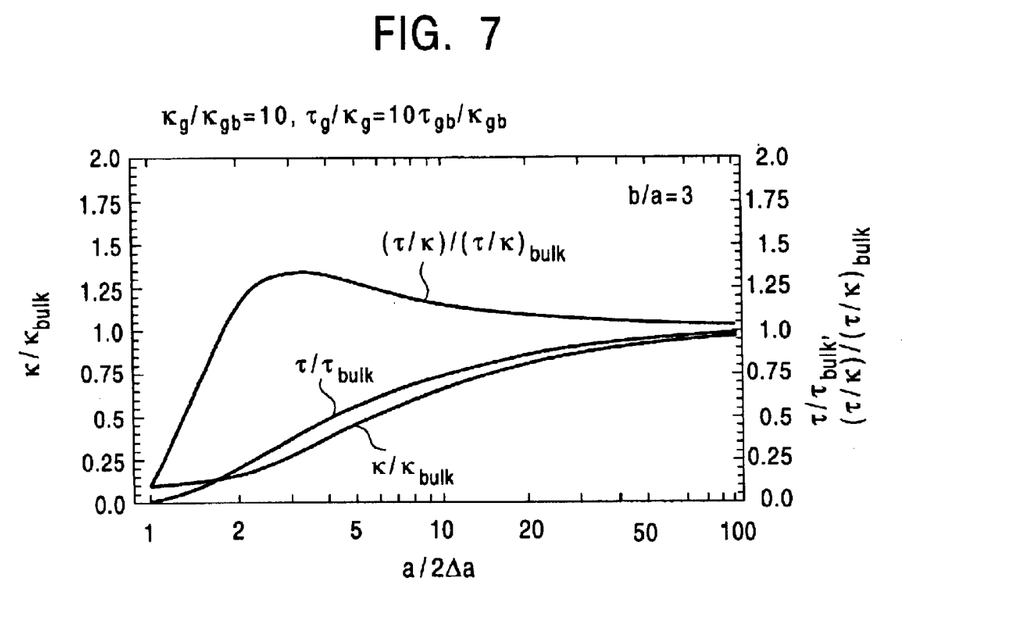
FIG. 7 is a graph illustrating $(\tau/\kappa)/(\tau/\kappa)_{bulk}$, $\tau/\tau_{bulk}$, and $\kappa/\kappa_{bulk}$ according to a/2Δa when $\kappa_g/\kappa_{gb}=10$ and $\tau_g/\kappa_g=10\cdot\tau_{gb}/\kappa_{gb}$, and b/a=3.
Figure 8:
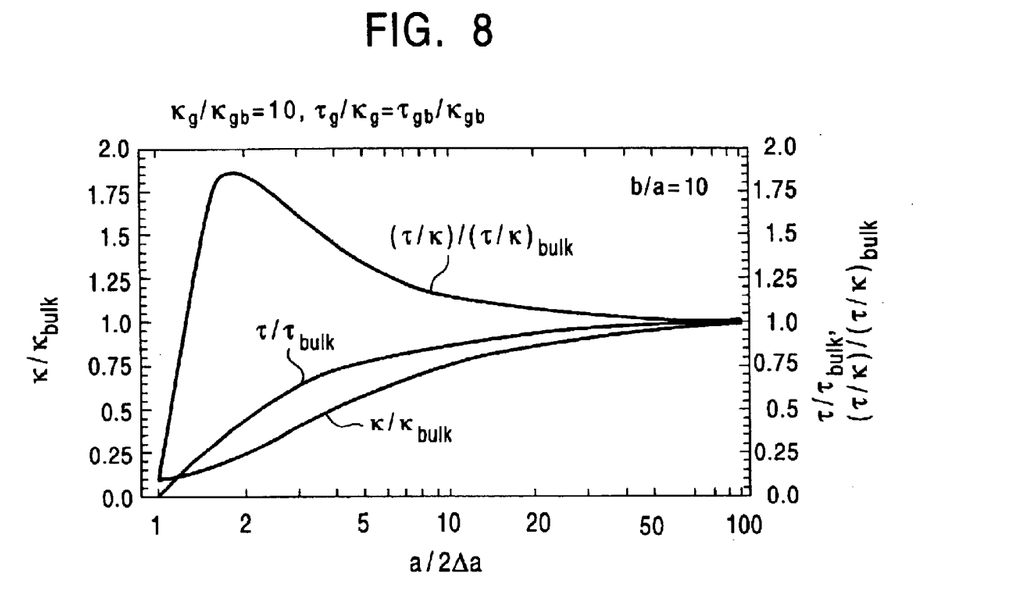
FIG. 8 is a graph illustrating $(\tau/\kappa)/(\tau/\kappa)_{bulk}$, $\tau/\tau_{bulk}$, and $\kappa/\kappa_{bulk}$ according to a/2Δa when $\kappa_g/\kappa_{gb}=10$ and $\tau_g/\kappa_g=\tau_{gb}/\kappa_{gb}$, and b/a=10.

When $b/a=3$, the result shown in FIG. 7 is obtained according to the same procedure as described for FIG. 5. When $b/a=10$, the result shown in FIG. 8 is obtained according to the same procedure as described for FIG. 6. FIGS. 7 and 8 show that the maximum value of the $\tau/\kappa$ ratio increases as the value of $b/a$ increases.

It is clear from the above results that the maximum value of the normalized $\tau/\kappa$ ratio in the small grain diameter region is large when the grain size in the thickness direction, that is, the grain height, is larger than the grain size in the planar direction.

FIGS. 6 to 8 show that $(\tau/\kappa)/(\tau/\kappa)_{bulk}$ in the vertical axis has a value exceeding 1 in some regions. Thus, when manufacturing a thin-film capacitor device having such a second dielectric thin-film, it is possible to estimate the value of $(\tau/\kappa)/(\tau/\kappa)_{bulk}$, which exceeds 1, and to reduce the thickness of the dielectric thin-film compared with a conventional one by controlling $a/2\Delta a$ in an appropriate range, for example, 2 to 12.

Figure 9:
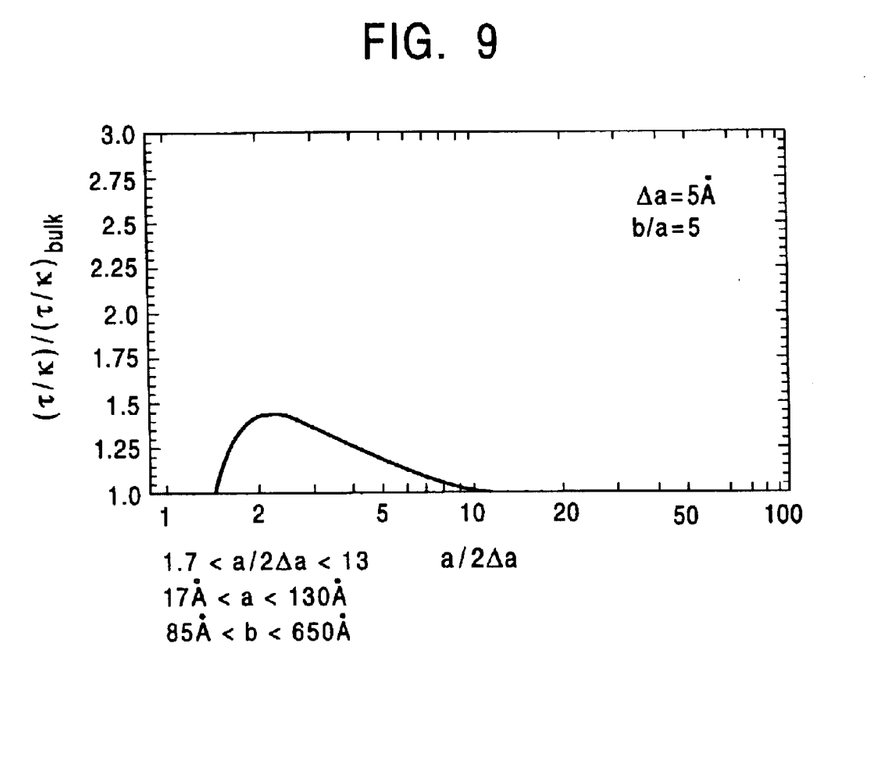
FIG. 9 is a graph illustrating $(\tau/\kappa)/(\tau/\kappa)_{bulk}$ according to a/2Δa when Δa=5 Å and b/a=5.

Based on the above results, $(\tau/\kappa)/(\tau/\kappa)_{bulk}$ is calculated using $a/2\Delta a$ as a variable when the grain boundary layer has a thickness of 5 Å and $b/a=5$, wherein a is the length of the principal crystal grain 8 in the planar direction and b is the height of the principal crystal grain 8 in the thickness direction, and the calculation results are shown in FIG. 9. FIG. 9 shows that $(\tau/\kappa)/(\tau/\kappa)_{bulk}$ exceeds 1, that is, it is in the range of $1.7 < a/2\Delta a < 13$. When using the above data, that is, 17 Å $< a <$ 130 Å and 85 Å $< b <$ 650 Å, a second dielectric thin-film having a smaller thickness than that of the conventional one can be obtained.

According to the above results, when the grain boundary layer has a thickness $\Delta a$ of 5 Å and a boundary layer between the electrode layer and the dielectric thin-film has a thickness of 50 Å and the dielectric thin-film estimated on the basis of an ideal single crystal has a thickness in the ranges of 250 Å to 500 Å, 500 Å to 1,000 Å, 1,000 Å to 2,000 Å, 2,000 Å to 5,000 Å, and 5,000 Å to 10,000 Å, the preferable grain size, the desired thickness, and a decrease in the thickness of the dielectric thin-film shown in Table 1 are obtained; wherein the thickness of the dielectric thin-film formed by adjusting the grain size in the above range is obtained by calculation.

TABLE 1

| Thickness of Single Crystal | Grain Size | Maximum Decrease in Thickness |
|---|---|---|
| 250 Å to 500 Å | 13 Å < a < 50 Å<br>85 Å < b < thickness | 38% |
| 500 Å to 1,000 Å | 12 Å < a < 80 Å<br>60 Å < b < thickness | 57% |
| 1,000 Å to 2,000 Å | 12 Å < a < 110 Å<br>60 Å < b < thickness | 60% |
| 2,000 Å to 5,000 Å | 12 Å < a < 130 Å<br>60 Å < b < thickness | 62% |
| 5,000 Å to 10,000 Å | 12 Å < a < 240 Å<br>50 Å < b < thickness | 63% |

As shown in Table 1, controlling the grain diameter a and the grain height b provides a 38% to 63% reduction in the thickness compared with that of dielectric thin-films made of a single crystal, that is, ones produced by conventional methods.

The above description is summarized as follows: the thickness of the first dielectric thin-film 4 is determined according to formula (1), $$t_C = \{(\epsilon_0/\kappa_C)/(C/S)\} - \{t_N(\kappa_C/\kappa_N)\},$$

and the thickness of the second dielectric thin-film 5 is determined according to formula (2), $$t_N = \{(\epsilon_C/\tau)/(C/S)\} \cdot \{1/(\tau_N/\kappa_N)\}.$$

Hitherto, in order to reduce the thickness of the second dielectric thin-film, that is, to decrease $t_N$, it has been necessary to find or develop materials having a large $\tau_N/\kappa_N$ ratio. The inventors have found that the temperature coefficient of capacitance and the $\tau_N/\kappa_N$ ratio change depending on the diameter and the height in the thickness direction of the principal crystal grain when the second dielectric thin-film is made of a specific material. The present invention provides a dielectric thin-film, having a thickness less than that of the conventional one and a desired temperature coefficient of capacitance by controlling the above parameters.

FIG. 9 shows that the parameters are preferably controlled in the range of $1.7 \leq a/2\Delta a \leq 13$ and $5 \leq b/a$ to achieve a 10% or more reduction in thickness and are preferably controlled in the range of $1.8 \leq a/2\Delta a \leq 6$ and $5 \leq b/a$ to achieve a 25% or more reduction in thickness.

An exemplary material of the second dielectric thin-film 5 satisfying the above conditions includes crystalline $Sr_xBa_{1-x}TiO_3$, crystalline $CaTiO_3$, crystalline $PbTiO_3$, and $TiO_2$.

Crystalline $Sr_xBa_{1-x}TiO_3$, crystalline $CaTiO_3$, and crystalline $PbTiO_3$ each have a phase transition temperature less than room temperature, a negative temperature coefficient of dielectric constant, and a relative dielectric constant of 100 or more at room temperature. When the second dielectric thin-film 5 made of the above material is provided in combination with the first dielectric thin-film 4 to adjust the temperature coefficient of capacitance of the capacitor, there is a problem in that a leakage current arises due to the low dielectric strength of the second dielectric thin-film 5. However, providing the first dielectric thin-film 4 having a higher dielectric strength than that of the second dielectric thin-film 5 in the capacitor solves the problem. A layer made of the above material may be formed by a deposition method such as sputtering.

The thin-film capacitor 1 having the above configuration has an excellent dielectric strength due to the high dielectric strength of the first dielectric thin-film 4. The thin-film capacitor device 1 has a multilayer structure having the first dielectric thin-film 4 and the second dielectric thin-film 5, that is, the structure is different from that of conventional sheet dielectric ceramics, thereby easily achieving a reduction in thickness, miniaturization, and a capacitor having a thickness of 5 µm or less.

Furthermore, the Q factor, the dielectric strength, and the temperature coefficient of capacitance of the capacitor can be adjusted by controlling the thicknesses of the first dielectric thin-film 4 and the second dielectric thin-film 5, and the composition thereof, thereby obtaining the thin-film capacitor device 1 having an excellent temperature stability in an operating environment in which changes in temperature are large.

As described above, the thin-film capacitor 1 shown in FIG. 1 is suitable for electronic devices such as portable electronic devices and microwave communication devices, which need temperature compensation. For example, the capacitor may be used in combination with a varactor diode that is an element for controlling the oscillation frequency according to voltage.

Figure 10:
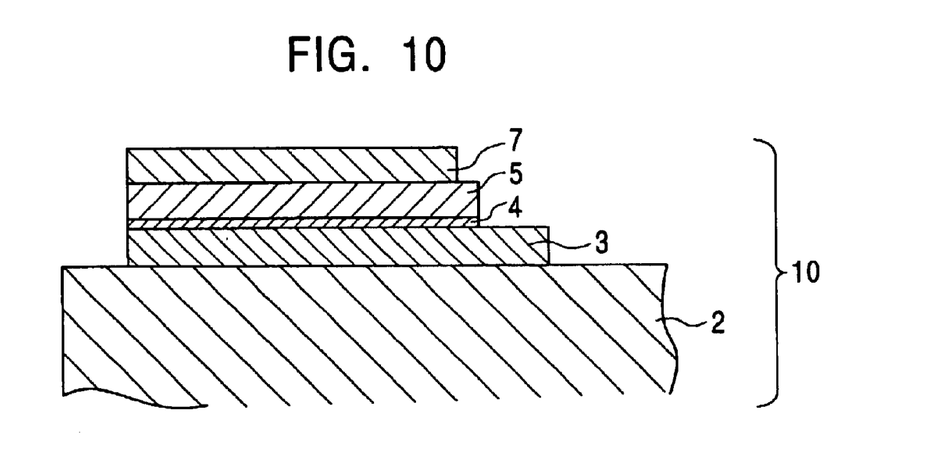
FIG. 10 is a sectional view showing another thin-film capacitor device for performing temperature compensation according to a second embodiment of the present invention.

In the above embodiment, the second dielectric thin-film 5 and the first dielectric thin-film 4 are deposited on the first electrode layer 3 in that order, and, as shown in FIG. 10, the first dielectric thin-film 4 may be deposited on the second dielectric thin-film 5 to form a thin-film capacitor device 10. The thin-film capacitor device 10 has the same effects as the thin-film capacitor device 1 of the first embodiment.

Figure 11:
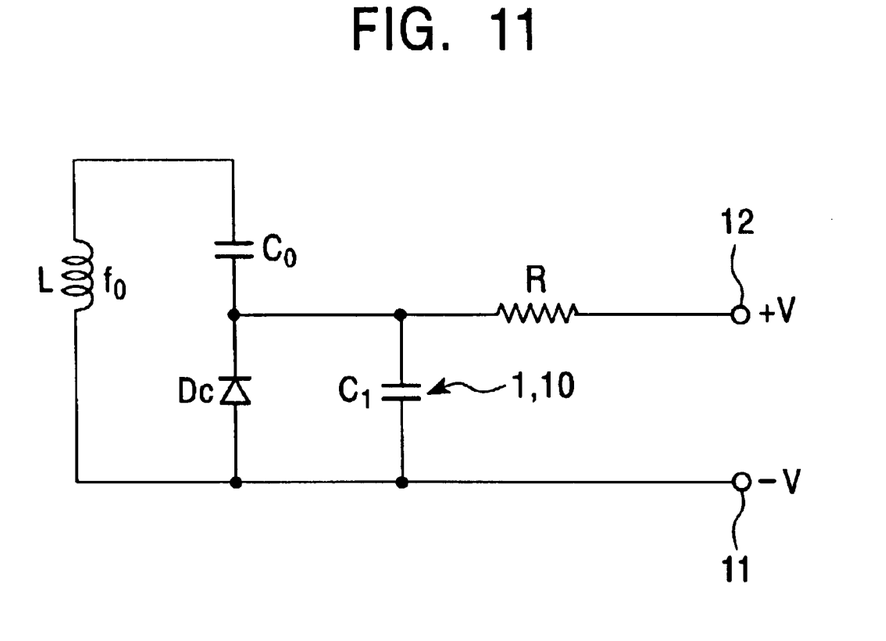
FIG. 11 shows an exemplary electric circuit having the thin-film capacitor device of the present invention.

FIG. 11 shows an exemplary resonant circuit in which a capacitor device $C_1$, which is the thin-film capacitor device 1 or 10 according to the present invention is used. In this example, a capacitor device $C_0$ and a varactor diode $D_C$ are connected in parallel to the coil L. The thin-film capacitor device $C_1$ is connected in parallel to the varactor diode $D_C$, the upper layer 7 and the upper layer 3 of the thin-film capacitor device $C_1$ are connected to input-output terminals 11 and 12, respectively, and a resistance R is placed between the input-output terminals 12 and the thin-film capacitor device $C_1$.

In the circuit shown in FIG. 11, the capacitance of the varactor diode $D_C$ changes according to voltage and the varactor diode Dc has a positive temperature coefficient of capacitance. Since the negative temperature coefficient of capacitance of the thin-film capacitor device $C_1$ compensates for that of the varactor diode $D_C$, the resonant circuit is stable under changes in temperature.

Figure 12:
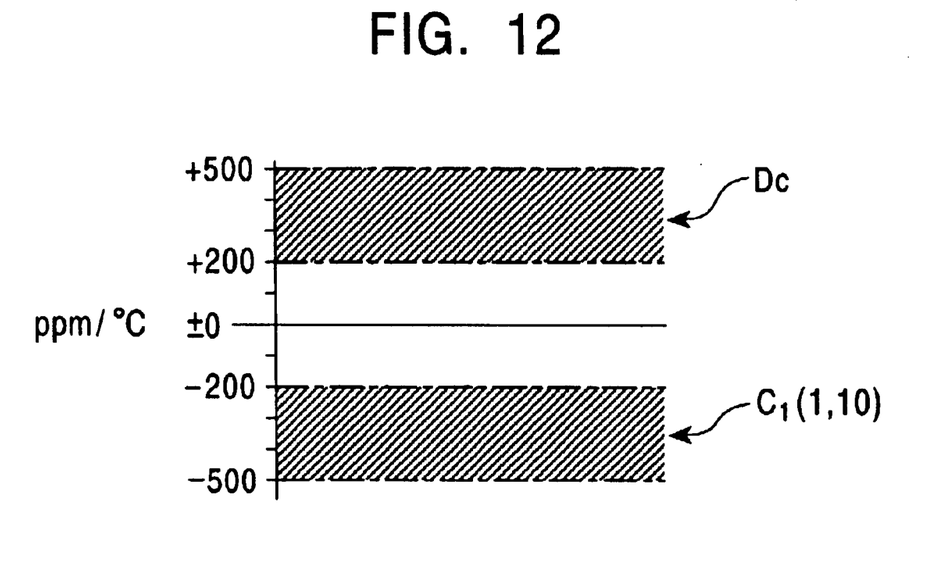
FIG. 12 is a conceptual diagram showing the temperature coefficients of capacitance of the thin-film capacitor device of the present invention and the temperature coefficient of capacitance of a varactor diode.

FIG. 12 shows the distribution of the temperature coefficients of capacitance thereof. When the temperature coefficient of capacitance of varactor diode Dc is in the range of 200 ppm/° C. to 500 ppm/° C. and the temperature coefficient of capacitance of the thin-film capacitor device $C_1$ is in the range of –200 ppm/° C. to –500 ppm/° C., adjusting both temperature coefficients of capacitance to appropriate values improves the temperature stability of the circuit. In conventional capacitor devices, the temperature coefficient of capacitance has not been controlled in such a wide range.

The thin-film capacitor device $C_1$ produced by the method according to the present invention surely has a temperature coefficient of capacitance of –220 ppm/° C. to –470 ppm/° C. Such a thin-film capacitor device can be widely used for temperature compensation and can be used for, for example, performing temperature compensation of a circuit using a varactor diode.

Figure 13:
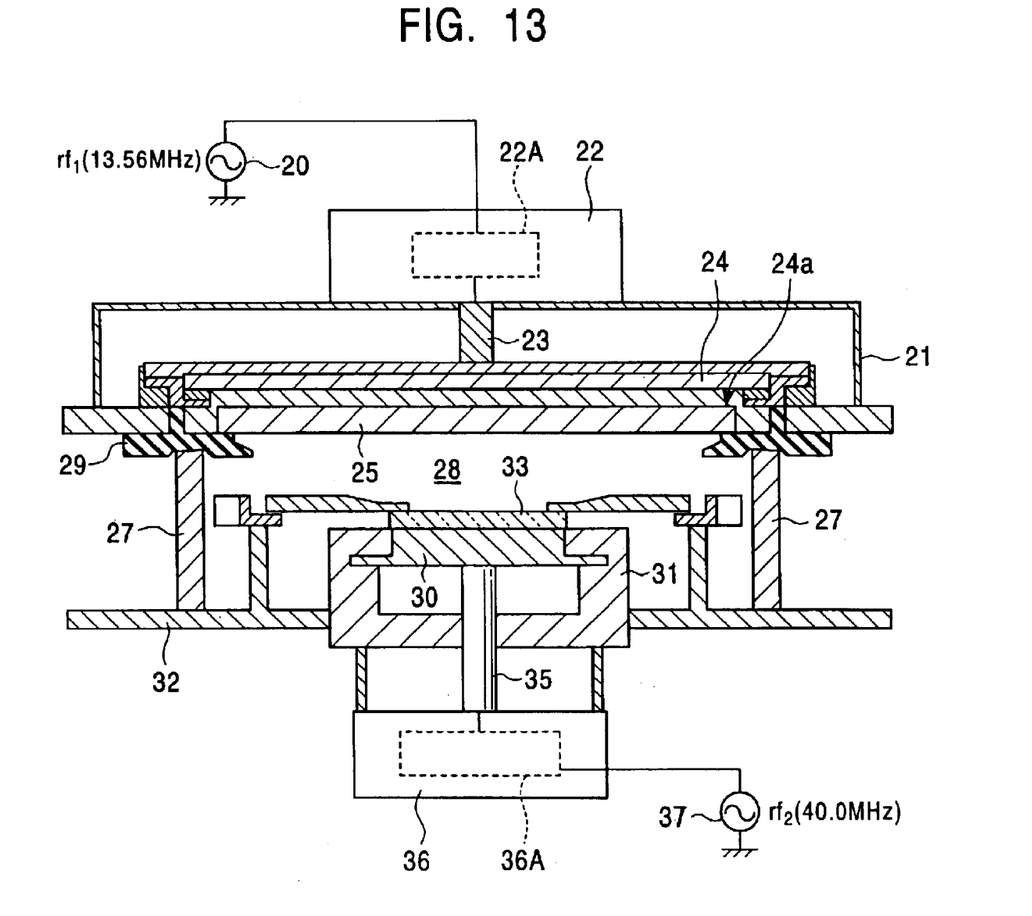
FIG. 13 is a sectional view showing an exemplary two-frequency excitation-type sputtering system preferably used for manufacturing a dielectric thin-film according to the present invention.

An exemplary deposition apparatus for forming the second dielectric thin-film 5 will now be described.

FIG. 13 shows an exemplary structure of a two-frequency excitation-type sputtering system suitable for forming the second dielectric thin-film 2. The sputtering system A has a first high frequency power source 20, a first electrode 24, and a matching circuit 22A placed therebetween. The matching circuit 22A adjusts impedance between the first high frequency power source 20 and the first electrode 24.

High frequency electricity from the first high frequency power source 20 is supplied to the first electrode 24 through the matching circuit 22A and a feeder board 23. The matching circuit 22A is housed in a matching box 22 which is a housing made of a conductor. The first electrode 24 and the feeder board 23 are covered with a chassis 21 made of a conductor.

A recessed portion 24a is provided below the first electrode 24, and a target 25 is detachably mounted to the recessed portion 24a in a fitted manner.

A deposition chamber 28, which is surrounded by chamber walls 27, is provided below the target 25, and the chassis 21 is disengaged from the chamber walls 27 by an insulator 29.

The deposition chamber 28 is connected to a vacuum pumping system with pipes, and the deposition chamber 28 is controlled in a reduced-pressure atmosphere, for example, $10^{-7}$ Pa. The apparatus and pipes of the vacuum pumping system are not shown in FIG. 13.

The deposition chamber 28 has a second electrode 30, a box-shaped shield support 31 supporting the second electrode 30, a substrate 33 which is made of glass or the like and placed on the second electrode 30, and a supporting bottom plate 32 attached under the chamber walls 27 to partition the deposition chamber 28. A shaft 35 is connected to the second electrode 30 through the bottom of the shield support 31. The shaft 35 is connected to a second matching circuit 36A housed in a second matching box 36 through a partition 36 provided at the bottom of the shield support 31. The second matching circuit 35A is connected to a second high frequency power source 37.

In the sputtering system shown in FIG. 13, the first high frequency power source 20 supplies electricity with a power of 1–3 kW and with a frequency of 13.56 MHz to the first electrode 24 and the second high frequency power source 37 supplies electricity with a frequency of 40 MHz to the second electrode 30; thereby creating plasma between the first electrode 24 and the second electrode 30. The plasma generates the component particles from the target 25 to deposit the particles on the substrate 33 and a required thin-film is formed on the substrate 33.

In the deposition chamber 28, the pressure is preferably maintained at about $10^{-7}$ Pa. High purity Ar gas, which is supplied to the deposition chamber 28, preferably has an impurity content of 1 ppb or less. Before performing the deposition, the deposition surface of the substrate 33 is cleaned with plasma created by supplying electricity with 13.56 MHz from the first high frequency power source 20.

When the first high frequency power source 20 supplies electricity with a frequency of 13.56 MHz and the second high frequency power source 37 supplies electricity with a frequency of 40 MHz to perform deposition, the electricity from the second high frequency power source 37 is used as bias electricity for the substrate 33; thereby performing sputtering by two-frequency excitation ion irradiation.

When an electrode layer and a dielectric thin-film are deposited on a substrate using the two-frequency excitation-type sputtering system in FIG. 13, the first high frequency power source 20 supplies electricity with a frequency of 13.56 MHz and the second high frequency power source 37 supplies electricity with a frequency of 40 MHz to perform deposition.

When performing the deposition, the grain size of the dielectric thin-film is adjusted by controlling the power of the electricity which is supplied from the second high frequency power source 37 and is applied to the substrate as bias electricity.

In a step of forming, for example, a $TiO_2$ dielectric thin-film, a dielectric thin-film including longitudinal principal crystal grains and one or two grain boundaries in the thickness direction is obtained when electricity with a power of 1.5 kW is supplied from the first high frequency power source 20 and bias electricity with a power of 0 W is supplied from the second high frequency power source 37. Another dielectric thin-film including principal crystal grains having a small diameter in the planar direction and including several dozen grain boundaries in the thickness direction is obtained when electricity with a power of 1.5 kW is supplied from the first high frequency power source 20 and bias electricity with a power of 200 W is supplied from the second high frequency power source 37. Thus, the grain diameter in the planar direction and the grain height in the thickness direction are adjusted by applying the bias electricity with a power in the above range, that is, 0–200 W.

Exemplary preferable conditions for manufacturing a $TiO_2$ dielectric thin-film are as follows: an $O_2$ partial pressure of 30–90% in an Ar atmosphere gas, electricity with a frequency of 1–3 kW from a first high frequency power source, electricity with a power of 0–400 W from a second high frequency power source, and a pressure of 0.5–10 Pa in a deposition chamber. Adding impurities such as gaseous $N_2$ and the like to the atmosphere gas is also effective in adjusting the grain size.

Accordingly, the grain size of the second dielectric thin-film can be adjusted by the above method and the properties of the second dielectric thin-film satisfies the condition $\{(\tau/\kappa)/(\tau_g/\kappa_g)\}>1$; thereby achieving reduction in the thickness of the dielectric thin-film.

EXAMPLES

Using a two-frequency excitation-type sputtering system shown in FIG. 13, a Cu lower electrode having a thickness of 1.3 μm was deposited on an alumina or glass substrate at room temperature.

Next, $CaTiO_3$ thin-films (second dielectric thin-film) each having a thickness of 2400 Å, 3500 Å and 4700 Å were deposited on the lower electrode, adjusting the grain size by a sputtering process under the conditions described below. Next, a-$SiN_x$ thin-films (first dielectric thin-film) each having a thickness of 900 Å, 700 Å and 500 Å were deposited, adjusting the grain size by a sputtering process under the conditions described below. A Cu upper electrode having a thickness of 1.3 μm was finally deposited by a sputtering process at room temperature to complete a multilayered thin-film capacitor device. These capacitors had a sheet capacitance of 480 pF/mm².

Other thin-film capacitor devices as comparative examples were prepared by a sputtering process without adjusting the grain size to compare the above thin-film capacitor devices.

The characteristics of these thin-film capacitor devices are shown in Table 2. In Table 2, the C film represents the first dielectric thin-film and the N film represents the second dielectric thin-film.

TABLE 2

| TCC (ppm/° C.) | $\kappa_N$ | $\tau_N$ (ppm/° C.) | $\tau_N/\kappa_N$ (ppm/° C.) | $t_C$ (Å) | $t_N$ (Å) |
|---|---|---|---|---|---|
| Examples | | | | | |
| −220 | 43 | −746 | −17.3 | 900 | 2,400 |
| −330 | 43 | −758 | −17.6 | 700 | 3,500 |
| −470 | 43 | −792 | −18.4 | 500 | 4,700 |
| Comparative Examples | | | | | |
| −220 | 170 | −1,700 | −10.0 | 1,100 | 4,100 |
| −330 | 170 | −1,700 | −10.0 | 1,000 | 6,100 |
| −470 | 170 | −1,700 | −10.0 | 900 | 8,700 |

Figure 2:
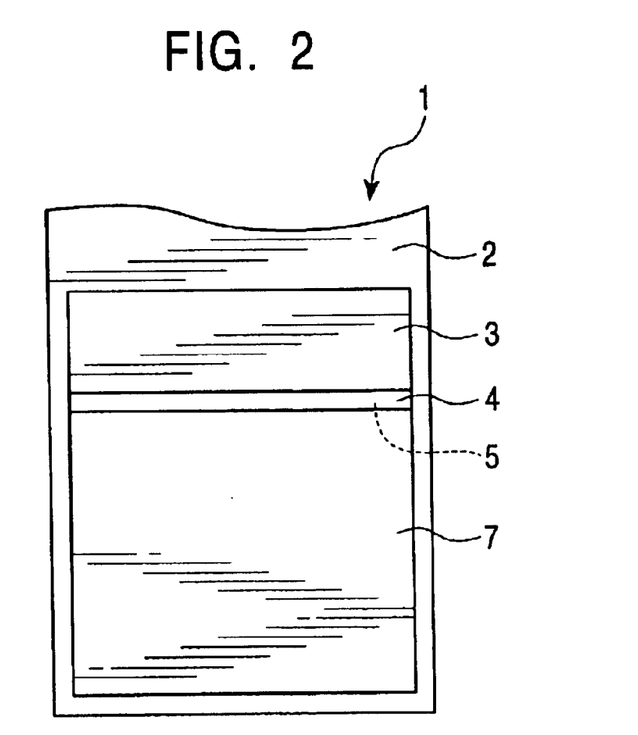
FIG. 2 is a plan view showing the thin-film capacitor device shown in FIG. 1.

When preparing the dielectric thin-films shown in FIG. 2 by sputtering process, the two-frequency excitation-type sputtering system described above was used and the power of bias electricity was changed in the range of 0–300 W.

For the second dielectric thin-films, Table 2 shows that each of the thin-film capacitor devices prepared by the method according to present invention has a smaller thickness than that of each of the corresponding conventional thin-film capacitor devices when each thin-film capacitor device of the present invention has the same temperature coefficients as that of each corresponding conventional thin-film capacitor device. That is, for the second dielectric thin-films, the thickness can be reduced from 4100 Å to 2400 Å, from 6100 Å to 3500 Å, and from 8700 Å to 2700 Å; thereby achieving a significant reduction in thickness.

Accordingly, in the thin-film capacitor device of the present invention having the same temperature coefficient of capacitance as that of conventional one, the thickness can be reduced and the temperature coefficient of capacitance can be controlled in the range of −220 to −470 ppm/° C.; hence, such devices suitably performs temperature compensation of elements such as varactor diode having a positive temperature coefficient of capacitance.

Figure 14:
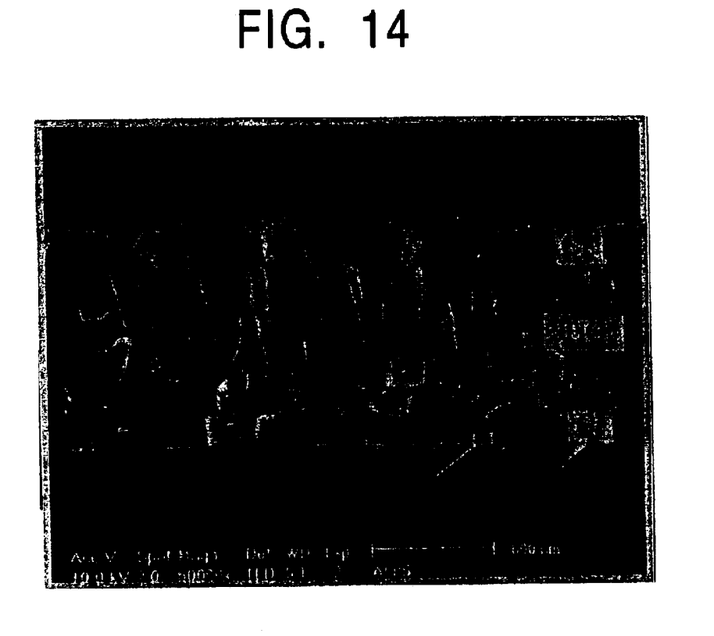
FIG. 14 is a photograph showing an exemplary sectional structure of a $TiO_2$ layer formed without bias electricity using the two-frequency excitation-type sputtering system shown in FIG. 13.
Figure 15:
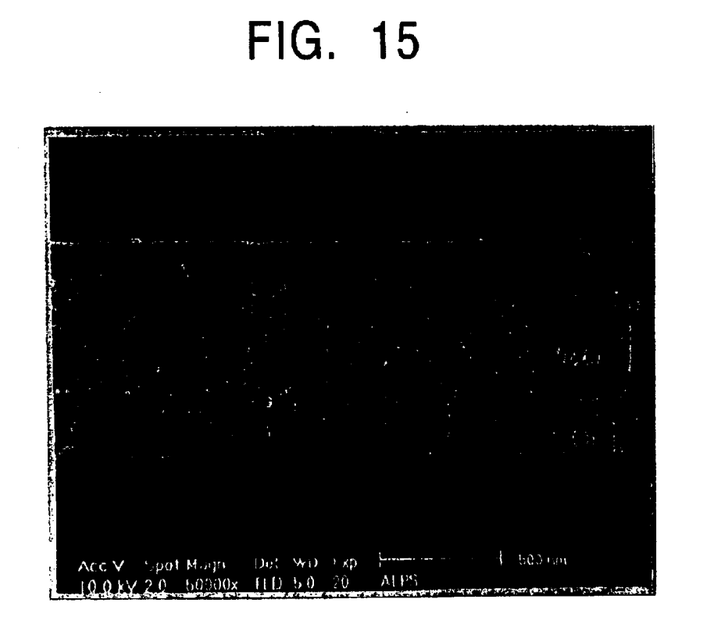
FIG. 15 is a photograph showing an exemplary sectional structure of a $TiO_2$ layer formed by applying bias electricity using the two-frequency excitation-type sputtering system shown in FIG. 13.

FIGS. 14 and 15 depict photographs showing sectional structures, each having a $TiO_2$ layer formed using a two-frequency excitation-type sputtering system shown in FIG. 13.

The layered structure shown in FIG. 14 has a glass substrate and a Cr electrode layer, the $TiO_2$ layer, and another Cr electrode layer which are deposited on the glass substrate in that order. The TiO$_2$ layer was formed under the following conditions: an O$_2$ partial pressure of 80%, electricity with a power of 1.5 kW from the first high frequency power source, electricity with a power of 0 W from the second high frequency power source, and a total pressure of 4 Pa in the deposition chamber.

The other layered structure shown in FIG. 15 has a glass substrate and a Cr electrode layer, the TiO$_2$ layer, and another Cr electrode layer which are deposited on the glass substrate in that order. The TiO$_2$ layer was formed under the following conditions: an O$_2$ partial pressure of 80%, electricity with a power of 1.5 kW from the first high frequency power source, electricity with a power of 200 W from the second high frequency power source, and a total pressure of 4 Pa in the deposition chamber.

The former layered structure shown in FIG. 14 has one or two grain boundaries in the thickness direction, and the latter layered structure shown in FIG. 15 has several dozen grain boundaries in the thickness direction. The above results indicate that the grain size of the dielectric thin-film can be adjusted by controlling the power of the bias electricity.

As described above, the present invention provides a thin-film capacitor device having a pair of electrode layers sandwiching a first dielectric thin-film and a second dielectric thin-film. The size of a principal crystal grain of the second dielectric thin-film is adjusted to a desired value; thereby achieving a reduction in the thickness of the second dielectric thin-film and subsequently achieving a reduction in the thickness of the entire thin-film capacitor device.

The first and second dielectric thin-films, each having a different relative dielectric constant, are sandwiched between the electrode layers; thereby achieving the adjustment of the Q factor and the dielectric strength and also performing temperature compensation.

Furthermore, when the first dielectric thin-film has a temperature coefficient of capacitance with an absolute value of 50 ppm/° C. or less and the second dielectric thin-film has a negative temperature coefficient of capacitance, the temperature coefficient can be adjusted in a wide range; thereby allowing the capacitor to perform temperature compensation.

In the adjustment of the grain size in the manufacturing method of the present invention, the ratio $\{(\tau/\kappa)/(\tau_g/\kappa_g)\}$ may exceed 1. When the ratio a/b of the principal crystal grain is constant, the ratio $a/2\Delta a$ may be determined such that the ratio $\{(\tau/\kappa)/(\tau_g/\kappa_g)\}$ exceeds 1, in the relationship between the ratio $a/2\Delta a$ and the ratio $\tau/\kappa$.

In the adjustment of the grain size in the manufacturing method of the present invention, the size of a principal grain size may be adjusted such that the ratio $(\tau(x)/\kappa(x))/(\tau_g/\kappa_g)$ is 1.10 or more, wherein $\kappa(x)/\kappa_g = \gamma[(x-1)^2/(\gamma x - 1 + \kappa_g/\kappa_{gb}) + \{(2-1/x)/\gamma\}/(\kappa_g/\kappa_{gb})]/x$, that is, $\kappa(x)$ indicates that the $\kappa$ is the function of x, $\tau(x)/\tau_g = 1 - [(\kappa_g/\kappa_{gb}) \cdot (1 - \tau_{gb}/\tau_g) \cdot \{(\kappa_g/\kappa_{gb})^2(x-1)^2 + (\gamma x - 1 + \kappa_g/\kappa_{gb})^2(2-1/x)\gamma\}/(\kappa_g/\kappa_{gb}) \cdot (\gamma x - 1 + \kappa_g/\kappa_{gb}) \cdot \{(x-1)^2 \cdot (\gamma x - 1 + \kappa_g/\kappa_{gb}) \cdot (2-1/x)/\gamma\}]$.

In the present invention, when the ratio $(\tau(x)/\kappa(x))/(\tau_g/\kappa_g)$ is 1.25 or more, a further reduction in the thickness is possible.

When the ratio $a/2\Delta a$ is in a specific range, a reduction in the thickness is possible.

In the present invention, when the second dielectric thin-film is made of any one selected from the group consisting of Sr$_x$Ba$_{1-x}$TiO$_3$, CaTiO$_3$, and PbTiO$_3$, adjustment of the temperature coefficient and a reduction in the thickness can be easily achieved by adjusting the grain size.

In an electronic device or an electronic circuit including the thin-film capacitor or the thin-film capacitor device manufactured by the above method, temperature compensation is possible in a wide range. Efficient temperature compensation is possible in combination with a varactor diode having a positive temperature coefficient.

What is claimed is:

1. An electronic circuit comprising a thin-film capacitor device and a varactor diode connected in parallel to the thin-film capacitor device, wherein the thin-film capacitor device has electrodes connected to respective input-output terminals and has a thin-film capacitor which is placed between the electrodes, and is manufactured by a method for manufacturing a thin-film capacitor having a desired sheet capacitance and a desired temperature coefficient of capacitance by depositing a first dielectric thin-film having a temperature coefficient of capacitance with an absolute value of 50 ppm/° C. or less and a second dielectric thin-film having a negative temperature coefficient of capacitance, wherein the second dielectric thin-film has a structure composed of an aggregation of principal grain units each having a principal crystal grain and grain boundary layers surrounding the principal crystal grain, includes a plurality of principal grain units, and has a thickness $t_N$, wherein $t_N = \{\epsilon_0 \tau_{rOr}/(C/S)\} \cdot \{1/(\tau/\kappa)\}$, (C/S represents the sheet capacitance, $\epsilon_0 \tau_{rOr}$ represents the desired temperature coefficient of capacitance), wherein $\tau$ represents the temperature coefficient of capacitance of the second dielectric thin-film, and $\kappa$ represents the relative dielectric constant of the second dielectric thin-film, the method comprising:

depositing the second dielectric thin-film so that the ratio $(\tau(x)/\kappa(x))/(\tau_g/\kappa_g)$ is 1.10 or more, wherein $\kappa(x)/\kappa_g = \gamma[(x-1)^2/(\gamma x - 1 + \kappa_g/\kappa_{gb}) + \{(2-1/x)/\gamma\}/(\kappa_g/\kappa_{gb})]/x$, that is, $\kappa(x)$ indicates that the $\kappa$ is the function of x, $\tau(x)/\tau_g = 1 - [(\kappa_g/\kappa_{gb}) \cdot (1 - \tau_{gb}/\tau_g) \cdot \{(\kappa_g/\kappa_{gb})^2(x-1)^2 + (\gamma x - 1 + \kappa_g/\kappa_{gb})^2(2-1/x)\gamma\}/(\kappa_g/\kappa_{gb}) \cdot (\gamma x - 1 + \kappa_g/\kappa_{gb}) \cdot \{(x-1)^2 \cdot (\gamma x - 1 + \kappa_g/\kappa_{gb}) \cdot (2-1/x)/\gamma\}]$, $\tau_g$ represents the temperature coefficient of capacitance of the principal crystal grain, $\kappa_g$ represents the relative dielectric constant of the principal crystal grain, x, which is a dimensionless parameter, represents the ratio $a/2\Delta a$, $\gamma$, which is a dimensionless parameter, represents the ratio b/a, $\kappa_{gb}$ represents the relative dielectric constant of the grain boundary, a represents the width of each principal grain unit, which includes the principal crystal grain and the grain boundary layers, in the lateral direction, $\Delta a$ represents the thickness of each grain boundary layer, $2\Delta a$ represents the thickness of a grain boundary, and b represents the height of the principal grain unit.

* * * * *